(12) United States Patent
Onoda

(10) Patent No.: US 6,198,109 B1
(45) Date of Patent: Mar. 6, 2001

(54) APERTURE APPARATUS USED FOR PHOTOLITHOGRAPHY AND METHOD OF FABRICATING THE SAME

(75) Inventor: Naka Onoda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/146,531

(22) Filed: Sep. 3, 1998

(30) Foreign Application Priority Data

Sep. 3, 1997 (JP) .................................................. 9-238155

(51) Int. Cl.⁷ ............................... G02B 5/00; G21K 1/00
(52) U.S. Cl. ............................................. 250/505.1; 430/5
(58) Field of Search .............................. 250/505.1, 503; 430/5

(56) References Cited

U.S. PATENT DOCUMENTS

| | | | |
|---|---|---|---|
| 4,254,174 | * 3/1981 | Flanders et al. | 250/505.1 |
| 4,775,797 | * 10/1988 | Stengl | 250/505.1 |
| 4,800,458 | * 1/1989 | Okita | 360/135 |
| 4,804,600 | 2/1989 | Kato et al. | 430/5 |
| 4,855,197 | * 8/1989 | Zapka et al. | 250/505.1 |
| 5,258,091 | * 11/1993 | Imai et al. | 250/505.1 |

FOREIGN PATENT DOCUMENTS 61-223841  10/1986 (JP).
9-92610  4/1997 (JP).

* cited by examiner

*Primary Examiner*—Bruce C. Anderson
(74) *Attorney, Agent, or Firm*—Sughrue, Mion, Zinn, Macpeak & Seas, PLLC

(57) ABSTRACT

There is provided an apparatus used for forming a pattern on a substrate by photolithography with electron beams, the apparatus including (a) an aperture formed with at least one opening through which electron beams are to pass, and (b) a holder for fixedly supporting the aperture therewith by means an adhesive, at least one of surfaces of the aperture and the holder at which the aperture is adhesively fixed to the holder, being formed with at least one groove for excessive portion of the adhesive to flow in. When an aperture is fixed onto a holder with an adhesive, an adhesive may be excessively applied on a surface of the aperture or holder. However, in accordance with the above-mentioned apparatus, since excessive adhesive is pooled in the groove, it is possible to avoid the excessive adhesive from being forced out to the opening of the aperture, and thus, it is possible to avoid forming an incorrect pattern on a photoresist film.

6 Claims, 9 Drawing Sheets

APERTURE APPARATUS USED FOR PHOTOLITHOGRAPHY AND METHOD OF FABRICATING THE SAME

BACKGROUND OF THE INVENTION

1. Field of the Invention

The invention relates to an apparatus including an aperture through which electron beams are radiated onto a patterned photoresist film formed on a semiconductor substrate for forming a circuit pattern thereon, and a holder for fixedly supporting the aperture therewith. The invention relates also to a method of fabricating such an apparatus.

2. Description of the Related Art

There has been widely used photolithography for forming a small pattern on a wafer as a semiconductor substrate. In such photolithography, there has been employed a step and repeat exposure system (stepper) in order to expose a patterned photoresist film to light. The stepper first employed ultra-violet ray beams as a light source. However, in these days, a light source emitting a light having a smaller wavelength has been employed in order to form a pattern in a smaller size. For instance, g-ray having a wavelength of 436 nm in a mercury lamp, i-ray having a wavelength of 365 nm in a mercury lamp, and then, KrF eximer laser beam having a wavelength of 249 nm have been employed so far.

A resolution can be increased by using a light source emitting a light having a smaller wavelength. However, such a light source is accompanied with reduction in a depth of focus, which causes a problem that sharpness of a pattern is degraded due to blooming.

For this reason, electron beam exposure draws attention, because it has a significantly greater depth of focus than light exposure. The electron beam exposure makes it possible to form a more highly resolved pattern than the light exposure, but has a shortcoming that it has a low throughput.

However, there has been developed an exposure process which solves the above-mentioned problem, namely, significant increases in throughput. In the exposure process, electron beams are focused into rectangular patterns in certain sizes by means of an aperture, the thus focused patterns are all transferred to a wafer at a time, and those patterns are connected to one another to thereby transfer all circuit patterns onto a wafer.

FIGS. 1A to 1D are cross-sectional views of an aperture used in the above-mentioned exposure system, illustrating respective steps of a method of fabricating the aperture.

As illustrated in FIG. 1A, first and second silicon substrates 1a and 1b are adhered to each other to thereby form a wafer 1. The first and second silicon substrates 1a and 1b are adhered to each other at a boundary surface 2. Then, the wafer 1 is formed at a surface thereof having a plane azimuth of (100) with a desired pattern of opening 1c by conventional photolithography and etching. Then, a protection film 3 for protecting the wafer 1 from wet etching is formed all over upper, side and lower surfaces of the wafer 1 by chemical vapor deposition (CVD). For instance, the protection film 3 is a silicon nitride film.

Then, as illustrated in FIG. 1B, a photoresist film is formed on a lower surface of the wafer 1, and then, is patterned so that the photoresist film has an opening below the openings 1c of the wafer 1. Then, the protection film 3 is dry etched with the patterned photoresist film 4 being used as a mask, to thereby form a window 5 in the protection film 3.

Then, as illustrated in FIG. 1C, the wafer 1 is etched back at a lower surface thereof at an area exposed through the window 5. The wafer 1 is etched by means of a wet etching solution until the first silicon substrate 1a appears. Namely, the second silicon substrate 1b is etched by an entire thickness thereof as well as the boundary surface 2. Thus, there is formed an opening 6 at a lower surface of the wafer 1. For instance, there may be used heated alkaline solution such as potassium hydroxide and hydrazine, as the wet etching solution.

Since a plane azimuth (111) appears in the opening 6 during the wet etching, the opening 6 can be designed to have a tapered wall.

Then, as illustrated in FIG. 1D, the patterned photoresist film 4 and the protection film 3 are all removed. Thereafter, an electrically conductive film 7 is formed on an upper surface of the wafer 1 by sputtering in order to prevent charge-up which would occur when electron beams are radiated onto an upper surface of the wafer 1. For instance, the electrically conductive film 7 is composed of Au.

Thus, there is completed an aperture 10 as illustrated in FIGS. 2A to 2C, wherein FIG. 2A is a cross-sectional view of the aperture 10, FIG. 2B is a top plan view of the aperture 10, and FIG. 2C is an enlarged view of the opening 6. As illustrated in FIG. 2B, the opening 6 formed in the aperture 10 consists of smaller openings 6a arranged in 4×3. Each of the openings 6a is designed to have a pattern as illustrated in FIG. 2C. That is, each of the openings 6a includes a plurality of horizontally extending slits 6b in parallel with one another. When electron beams are radiated to a photoresist film through the opening 6 having a plurality of the smaller openings 6a each of which includes the slits 6b, portions of the photoresist film in alignment with the slits 6b are exposed, and hence, such portions of the photoresist film are etched out, or are not etched out.

The thus completed aperture 10 is fixed onto a holder 20, as illustrated in FIGS. 3A and 3B. The holder 20 is constructed as a frame having a central window 21 through which the opening 6 of the aperture 10 is exposed, and has a stepped portion 22 having a reduced thickness, around the central window 21. The stepped portion 22 has an upper surface as an adhesion surface 23 on which the aperture 10 is adhered at its marginal portion by means of an adhesive layer 30 composed of silver paste, for instance. For instance, the aperture 10 is fixed onto the stepped portion 22 of the holder 20 by first applying the adhesive on the adhesion surface 23, and compressing the aperture 10 onto the stepped portion 22.

The apparatus including the aperture 10 fixed onto the holder 20, which has been explained with reference to FIGS. 1A to 3B, has a problem that a portion 30a of the adhesive 30 may be forced out into the central window 21 of the holder 20, or a portion 30b may be forced out onto an upper surface of the aperture 10, passing between the aperture 10 and the holder 20. Those portions 30a and 30b of the adhesive 30 contaminates the apparatus, and causes problems of reduction in an accuracy of painting with electron beams, and reduction in a lifetime of the aperture 10.

In particular, if the portion 30a of the adhesive 30 is forced out into the central window 21 in a significantly excessive amount, the portion 30a may disadvantageously reach the opening 6 of the aperture 10, and may partially cover the slits 6b of the opening 6 therewith, as illustrated in FIG. 4B. If electron beams are radiated onto a photoresist film with the slits 6b being covered with the adhesive 30b, there would be generated a defect 31 in a photoresist pattern PR, as illustrated in FIG. 4C.

SUMMARY OF THE INVENTION

It is an object of the present invention to provide an aperture apparatus and a method of fabricating the same both of which are capable of preventing an adhesive from being forced out into an opening of an aperture or onto an upper surface of an aperture.

In one aspect of the present invention, there is provided an apparatus used for forming a pattern on a substrate by photolithography with electron beams, the apparatus including (a) an aperture formed with at least one opening through which electron beams are to pass, and (b) a holder for fixedly supporting the aperture therewith by means an adhesive. A surface of the aperture and/or a surface of the holder, at which the aperture and the holder are adhesively fixed to each other, are(is) formed with at least one groove for excessive portion of the adhesive to flow in.

For instance, the surface of the aperture may be formed with a plurality of grooves along an edge of the aperture. Similarly, the surface of the holder may be formed with a plurality of grooves along an edge of the holder.

It is preferable that the holder is formed with at least one through-hole communicating at least one of the grooves to atmosphere. If the holder is formed with a plurality of grooves, it is preferable that the grooves are in communication with one another.

There is further provided an apparatus used for forming a pattern on a substrate by photolithography with electron beams, the apparatus including (a) an aperture formed with at least one opening through which electron beams are to pass, and (b) a holder for fixedly supporting the aperture therewith by means an adhesive. The holder is formed at a surface thereof, at which the aperture is adhesively fixed to the holder, with at least one groove for excessive portion of the adhesive to flow in, along an edge of the holder, and further with a plurality of through-holes perpendicularly extending from the groove to communicate the groove to atmosphere.

In another aspect of the present invention, there is provided a method of fabricating an apparatus used for forming a pattern on a substrate by photolithography with electron beams, the method including (a) adhering first and second semiconductor substrates with each other, (b) forming a patterned recess on a surface of the first semiconductor substrate, (c) etching the second semiconductor substrate by an entire thickness thereof to thereby form an opening at a lower surface thereof below the patterned recess of the first semiconductor substrate, (d) forming at least one groove on a lower surface of the second semiconductor substrate around the opening, and (e) fixing the adhered first and second semiconductor substrates at a lower surface thereof onto a holder by means of an adhesive.

There is further provided a method of fabricating an apparatus used for forming a pattern on a substrate by photolithography with electron beams, the method including (a) adhering first and second semiconductor substrates with each other, (b) forming a patterned recess on a surface of the first semiconductor substrate, (c) etching the second semiconductor substrate by an entire thickness thereof to thereby form an opening at a lower surface thereof below the patterned recess of the first semiconductor substrate, (d) forming at least one groove on a surface of a holder to which the adhered first and second semiconductor substrates are to be fixed in such a manner that the groove is located around the opening when the adhered first and second semiconductor substrates are fixed onto the holder, (e) fixing the adhered first and second semiconductor substrates at a lower surface thereof onto the holder by means of an adhesive.

It is preferable that the method may further include the step of forming at least one groove on a lower surface of the second semiconductor substrate.

It is preferable that the method may further include the step of forming the holder with at least one through-hole communicating the groove to atmosphere.

In accordance with the above-mentioned apparatus or method, an excessive portion of an adhesive flows in the groove or grooves when the aperture is fixed onto the holder by means of the adhesive, and hence, it is possible to prevent an excessive portion of an adhesive from being forced out into an opening of the aperture or onto an upper surface of the aperture. Hence, the opening or upper surface of the aperture is not contaminated with an adhesive, which ensures less defectives and a higher fabrication yield. In addition, since an adhesive is prohibited from entering the opening of the aperture, a pattern in the opening is no longer contaminated with an adhesive, which ensures formation of a pattern with higher accuracy and reliability.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 5A:
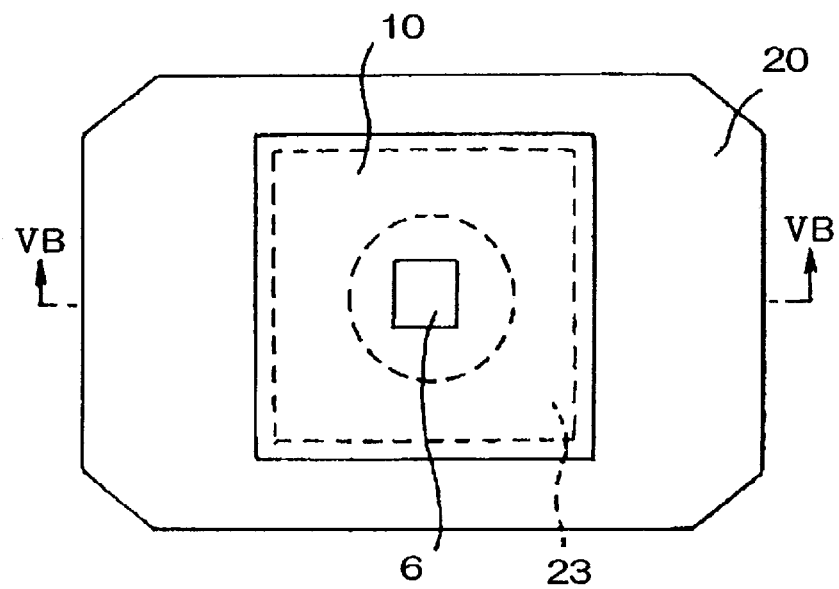
FIG. 5A is a top plan view of an aperture apparatus in accordance with the first embodiment of the present invention.
Figure 5B:
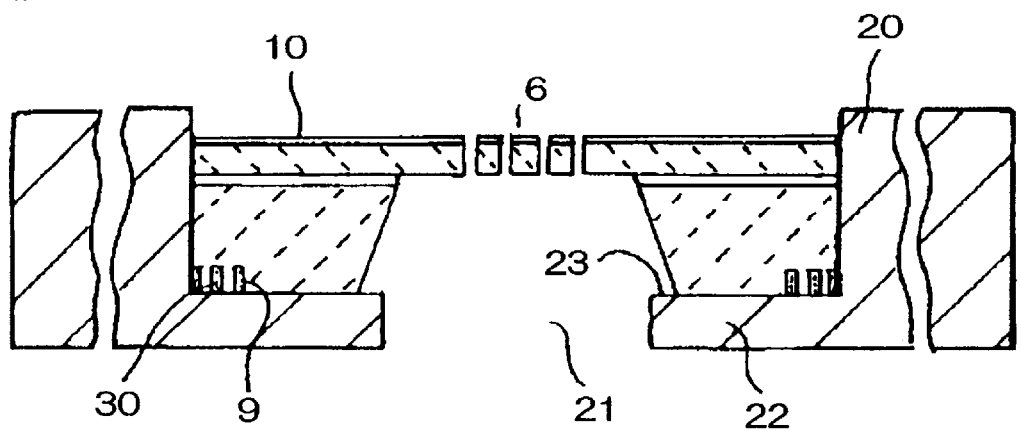
FIG. 5B is a cross-sectional view taken along the line VB—VB in FIG. 5A.

FIGS. 5A and 5B illustrate an aperture apparatus in accordance with the first embodiment. The illustrated aperture apparatus is comprised of an aperture 10 having an opening 6 at a lower surface thereof, and a holder 20 on which the aperture 10 is fixed.

The holder 20 is constructed as a frame having a central window 21 through which the opening 6 of the aperture 10 is exposed, and has a stepped portion 22 having a reduced thickness, around the central window 21. The stepped portion 22 has an upper surface as an adhesion surface 23 on which the aperture 10 is adhered at its marginal portion by means of an adhesive layer 30. As illustrated in FIG. 5B, the aperture 10 is fixed onto the stepped portion 22 of the holder 20 by first applying the adhesive 30 on the adhesion surface 23, and compressing the aperture 10 onto the stepped portion 22.

Figure 6A:
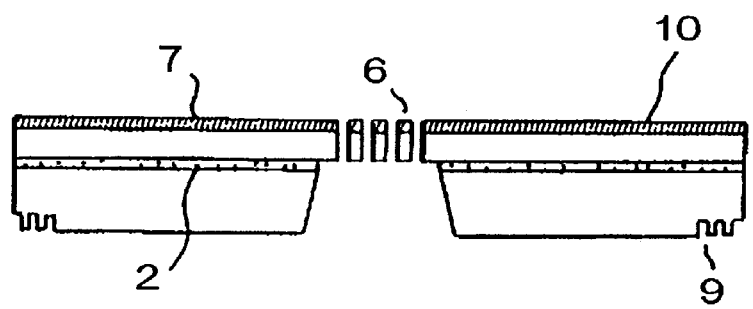
FIG. 6A is a cross-sectional view of an aperture of the aperture apparatus illustrated in FIG. 5A.
Figure 6B:
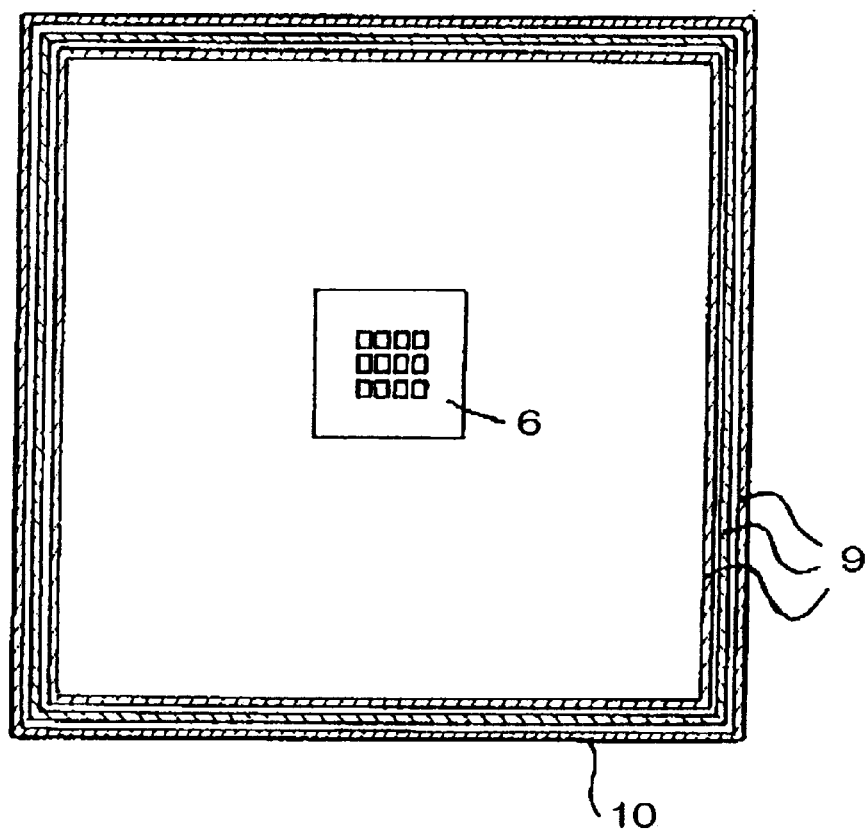
FIG. 6B is a bottom view of the aperture illustrated in FIG. 6A.

FIGS. 6A and 6B are cross-sectional and bottom views of the aperture 10. As illustrated, the aperture 10 is formed at a lower surface thereof with a plurality of rectangular grooves 9. The grooves 9 are designed to extend along edges of the aperture 10 in parallel with one another.

FIGS. 7A to 7F are cross-sectional views of the aperture 10 illustrated in FIGS. 6A and 6B, each illustrating respective step of a method of fabricating the aperture 10.

Figure 7A:
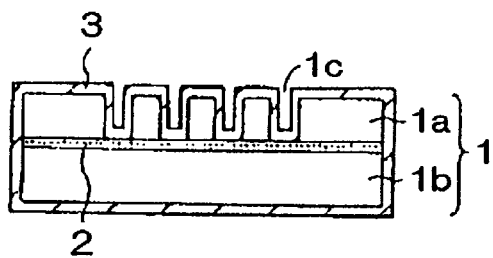
FIGS. 7A to 7F are cross-sectional views of an aperture of the aperture apparatus illustrated in FIG. 5A, each illustrating respective step of a method of fabricating the same.

As illustrated in FIG. 7A, first and second silicon substrates 1a and 1b are adhered to each other to thereby form a wafer 1. The first and second silicon substrates 1a and 1b are adhered to each other at a boundary surface 2. Then, the wafer 1 is formed at a surface thereof having a plane azimuth of (100) with a desired pattern of opening 1c by conventional photolithography and etching.

Then, a protection film 3 for protecting the wafer 1 from wet etching is formed all over upper, side and lower surfaces of the wafer 1 by chemical vapor deposition (CVD). For instance, the protection film 3 is a silicon nitride film.

Figure 7B:
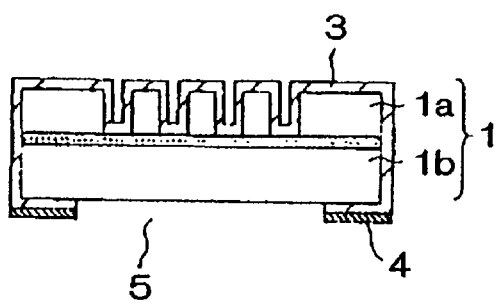

Then, as illustrated in FIG. 7B, a photoresist film is formed on a lower surface of the wafer 1, and then, is patterned so that the photoresist film has an opening below the openings 1c of the wafer 1. Then, the protection film 3 is dry etched with the patterned photoresist film 4 being used as a mask, to thereby form a window 5 in the protection film 3 below the openings 1c of the wafer 1.

Figure 7C:
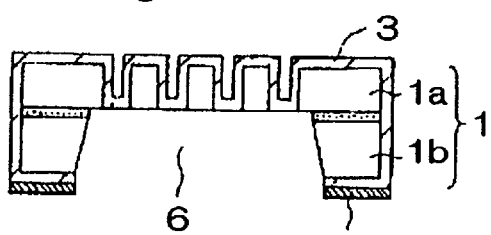

Then, as illustrated in FIG. 7C, the wafer 1 is etched back at a lower surface thereof at an area exposed through the window 5. The wafer 1 is etched by means of a wet etching solution until the first silicon substrate 1a appears. Namely, the second silicon substrate 1b is etched by an entire thickness thereof as well as the boundary surface 2, as illustrated in FIG. 7C. Thus, there is formed an opening 6 at a lower surface of the wafer 1. For instance, there may be used heated alkaline solution such as potassium hydroxide and hydrazine, as the wet etching solution.

Since a plane azimuth (111) appears in the opening 6 during the wet etching, the opening 6 can be designed to have a tapered wall.

Figure 7D:
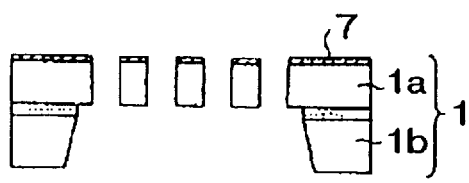

Then, as illustrated in FIG. 7D, the patterned photoresist film 4 and the protection film 3 are all removed. Thereafter, an electrically conductive film 7 is formed on an upper surface of the wafer 1 by sputtering in order to prevent charge-up which would occur when electron beams are radiated onto an upper surface of the wafer 1. For instance, the electrically conductive film 7 is composed of Au.

Figure 7E:
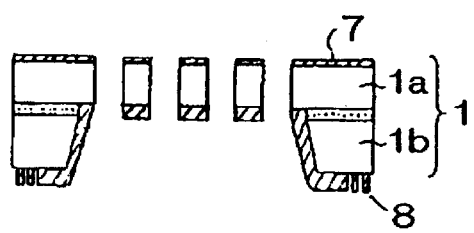

Then, as illustrated in FIG. 7E, a photoresist mask 8 is formed on a lower surface of the wafer 1 around the opening 6. The photoresist mask 8 is formed with a plurality of groove-shaped openings. The wafer 1 is etched back at a lower surface thereof with the photoresist mask 8 being used as an etching mask. As a result, a plurality of the grooves 9 are formed at a lower surface of the wafer 1, as illustrated in FIG. 6B.

Figure 7F:
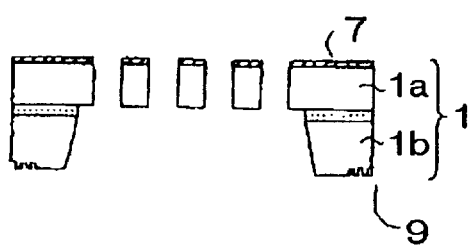

Thereafter, the photoresist mask 8 is removed. Thus, there is completed the aperture 10 used in the first embodiment, as illustrated in FIG. 7F.

The thus fabricated aperture 10 is fixed onto the holder 20 by means of the adhesive 30, as illustrated in FIG. 5B, by applying the adhesive 30 onto the adhesion surface 23 of the stepped portion 22 of the holder 20, and then, compressing the aperture 10 onto the holder 20. When the aperture 10 is compressed onto the stepped portion 22 of the holder 20, an excessive portion of the adhesive 30 is forced to flow into the grooves 9 formed at a lower surface of the aperture 10. Hence, it is possible to prevent the adhesive 30 from being forced out into the opening 6 or onto an upper surface of the aperture 10. Thus, problems of contamination of the opening 6 with the adhesive 30, reduction in painting accuracy of electron beams, and reduction in a lifetime of an aperture are all solved.

Figure 8A:
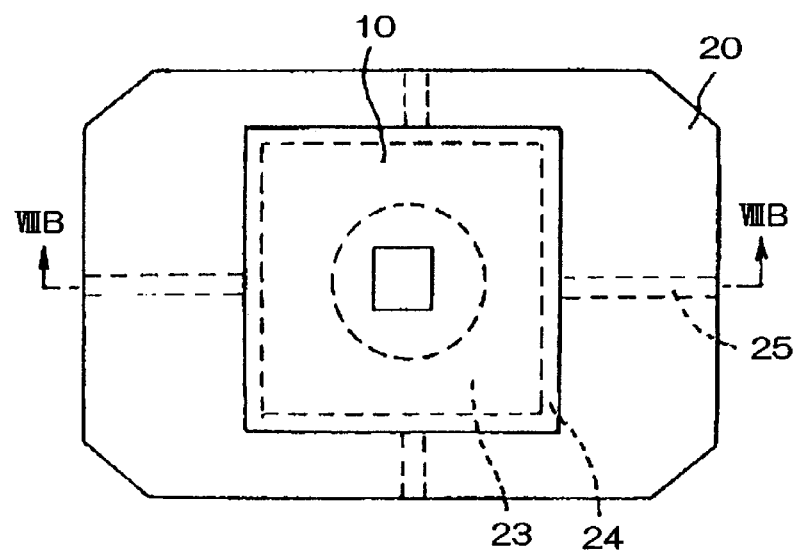
FIG. 8A is a top plan view of an aperture apparatus in accordance with the second embodiment of the present invention.
Figure 8B:
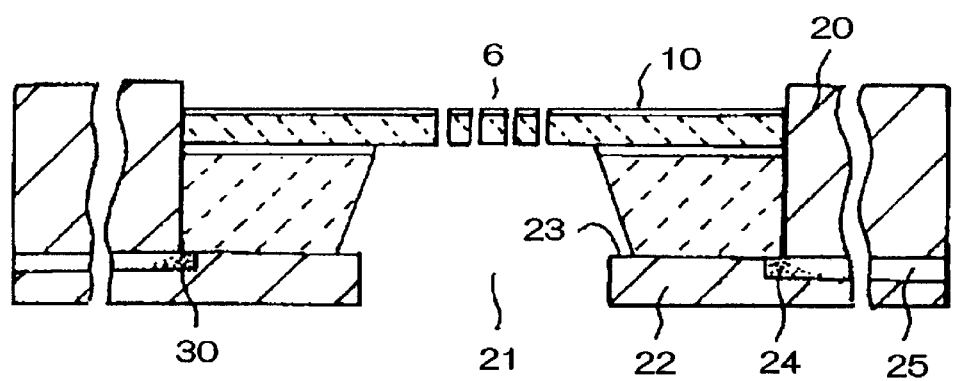
FIG. 8B is a cross-sectional view taken along the line VIIIB—VIIIB in FIG. 8A.

FIGS. 8A and 8B illustrate an aperture apparatus in accordance with the second embodiment. Parts or elements corresponding to or equivalent to those in the first embodiment have been provided with the same reference numerals.

Figure 1A:
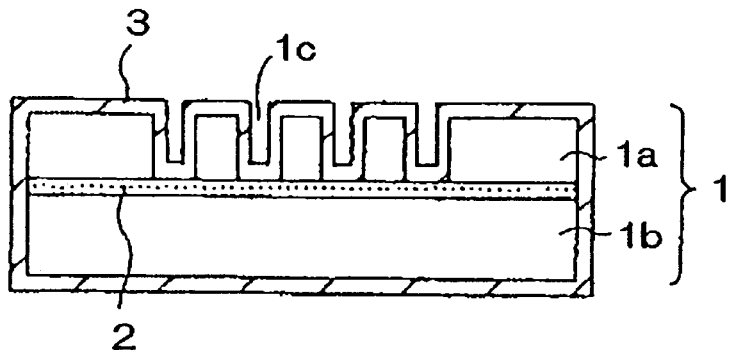
FIGS. 1A to 1D are cross-sectional views of a conventional aperture, illustrating respective step of a method of fabricating the same.
Figure 1B:
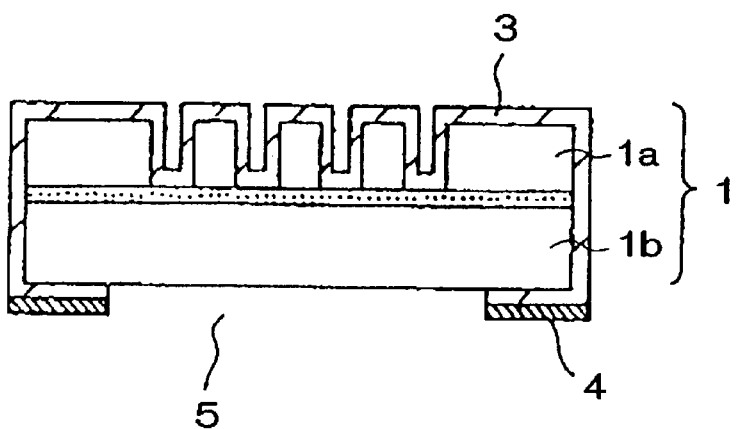
Figure 1C:
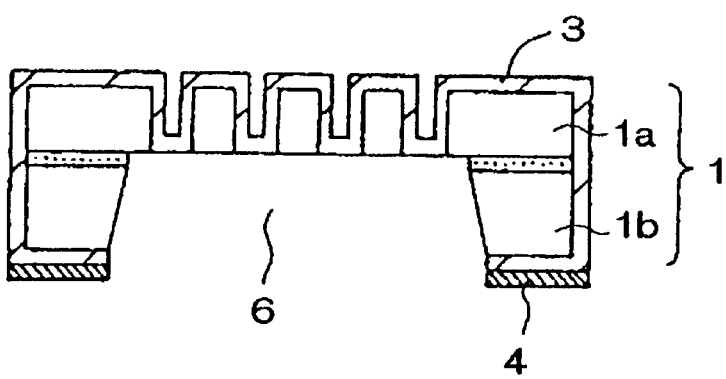
Figure 1D:
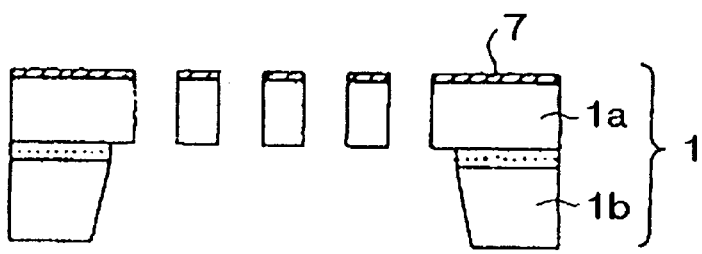
Figure 2A:
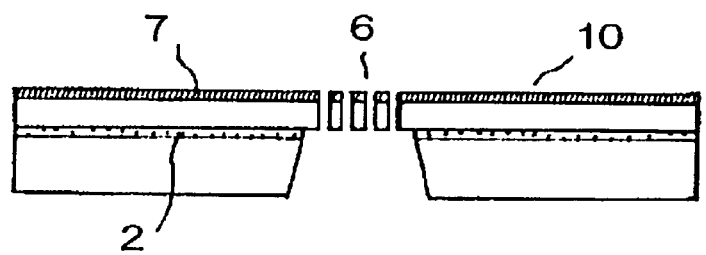
FIG. 2A is a cross-sectional view of the conventional aperture illustrated in FIGS. 1A to 1D.
Figure 2B:
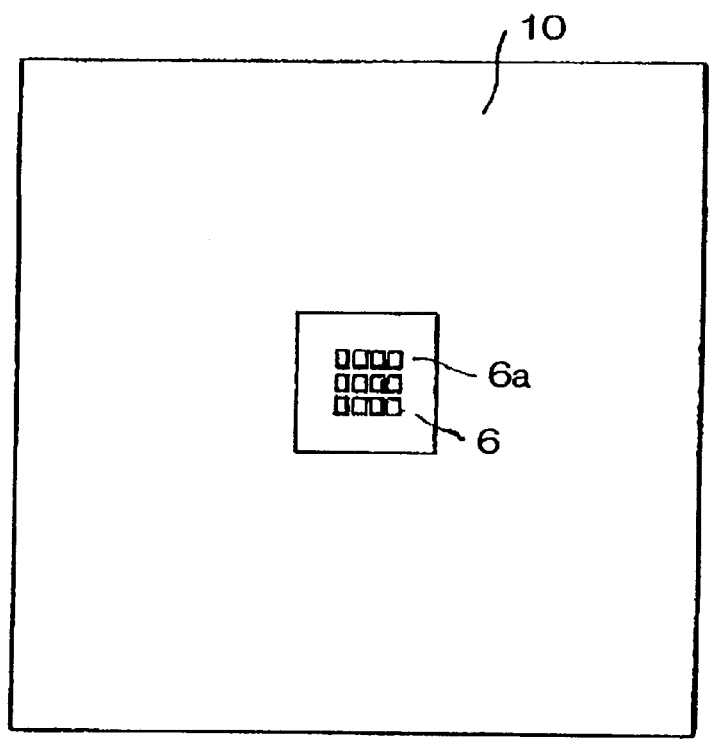
FIG. 2B is a top plan view of the conventional aperture illustrated in FIG. 2A.
Figure 2C:
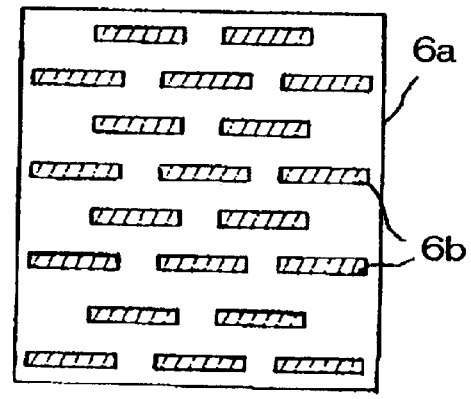
FIG. 2C is an enlarged view of an opening.
Figure 3A:
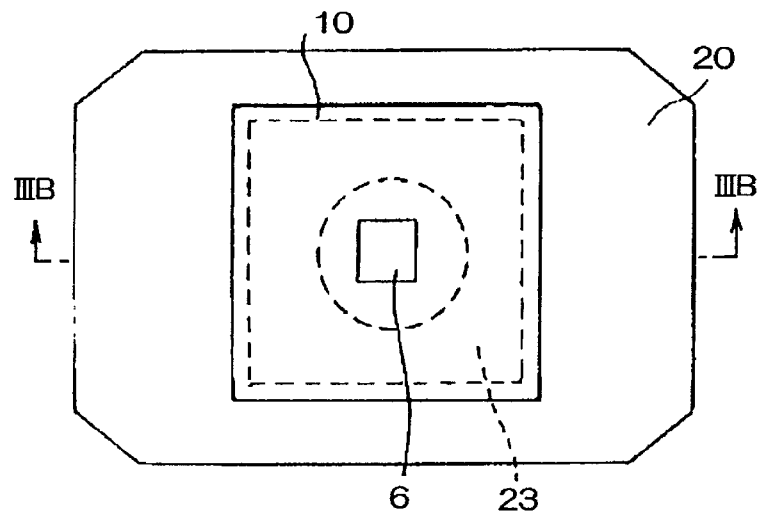
FIG. 3A is a top plan view of a conventional aperture apparatus.
Figure 3B:
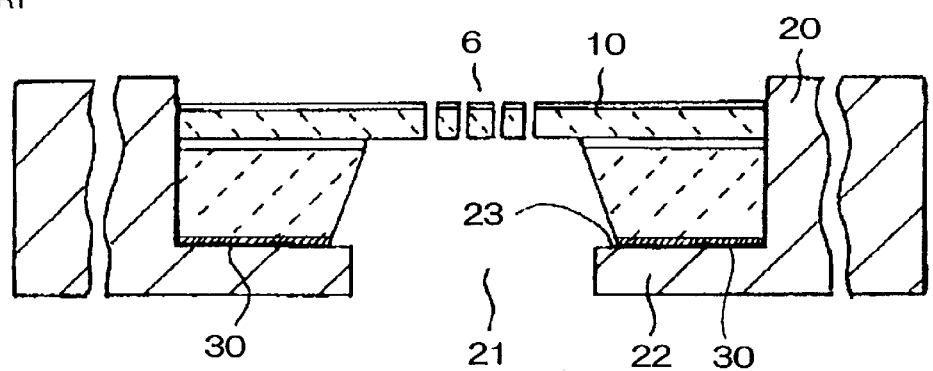
FIG. 3B is a cross-sectional view taken along the line IIIB—IIIB in FIG. 3A.
Figure 4A:
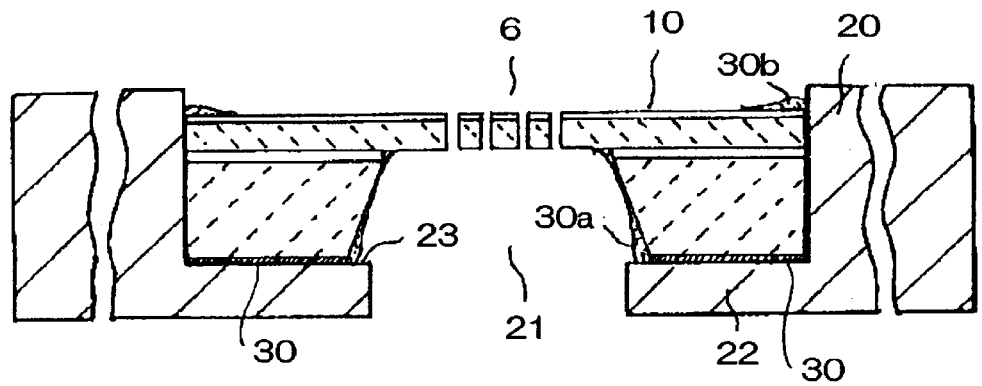
FIG. 4 is a cross-sectional view of a conventional aperture apparatus.
FIG. 4B is an enlarged view of an opening of the aperture apparatus illustrated in FIG. 4A.
FIG. 4C is an enlarged view of a pattern formed by means of the aperture apparatus illustrated in FIG. 4A.
Figure 4B:
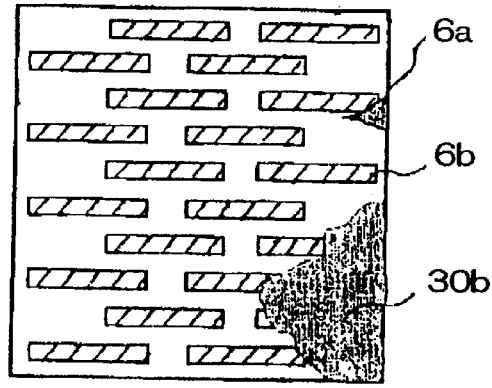
Figure 4C:
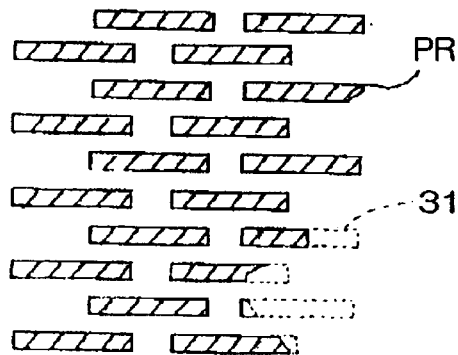

In the second embodiment, the conventional aperture 6 illustrated in FIG. 2A is employed as the aperture 10. The holder 20 is formed at the adhesion surface 23 of the stepped portion 22 with a groove 24 extending along edges of the stepped portion 22.

The holder 20 is formed inside at four sides thereof further with horizontally extending through-holes 25. Each of the through-holes 25 extends perpendicularly to the groove 24, and communicates the groove 24 to an outer surface of the holder 20, namely, communicates the groove 24 to atmosphere. The holder 20 is formed by mechanically processing a metal plate. It is possible to form the stepped portion 22, the groove 24, and the through-holes 25 by cutting work.

The aperture 10 is fixed onto the holder 20 in a conventional manner. That is, the aperture 10 is fixed onto the holder 20 by applying the adhesive 30 on the adhesion surface 23 of the stepped portion 22 of the holder 20, and compressing the aperture 10 onto the stepped portion 22. During compression of the aperture 10 onto the stepped portion 22, an excessive portion of the adhesive 30 sandwiched between the aperture 10 and the stepped portion 22 is forced to flow into the groove 24 formed at the adhesion surface 23 of the stepped portion 22. Since air existing in the groove 24 is discharged outside through the through-holes 25, the excessive portion of the adhesive 30 can smoothly flow into the groove 24.

If the adhesive 30 flows into the groove 24 too excessively, the adhesive 30 is partially forced out into the through-holes 25. As a result, it is possible to prevent the adhesive 30 from being forced out into the opening 6 or onto an upper surface of the aperture 10. Thus, problems of contamination of the opening 6 with the adhesive 30, reduction in painting accuracy of electron beams, and reduction in a lifetime of an aperture are all solved.

Figure 9A:
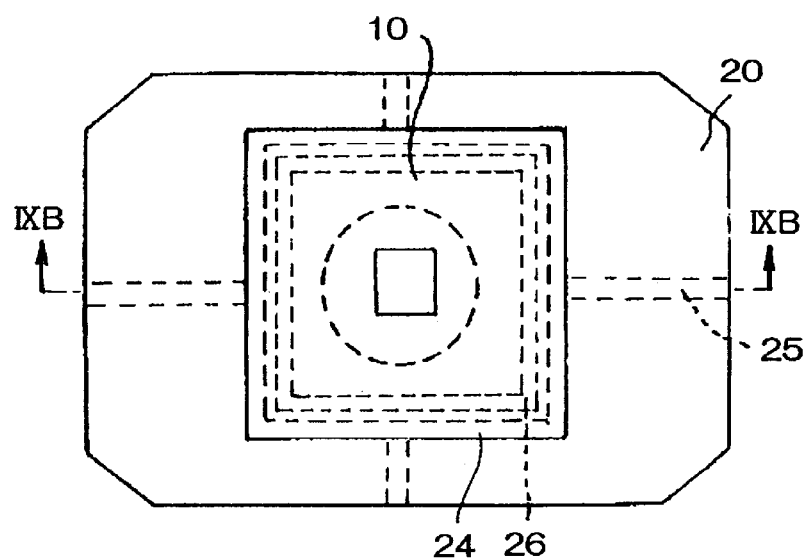
FIG. 9A is a top plan view of an aperture apparatus in accordance with the third embodiment of the present invention.
Figure 9B:
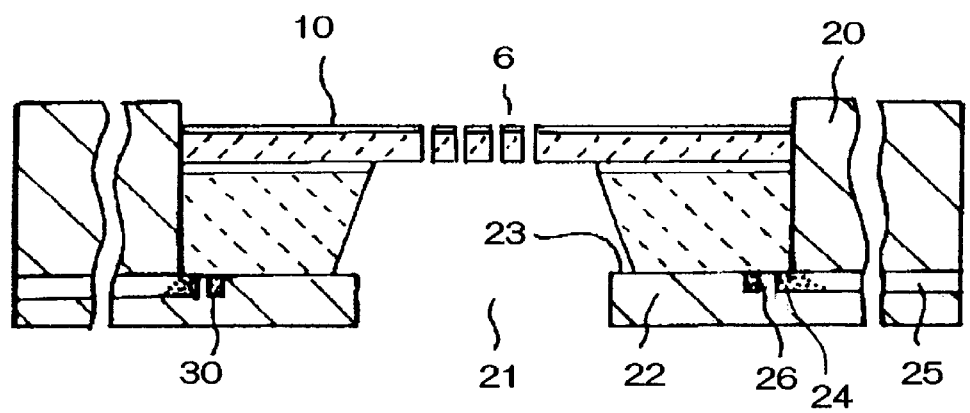
FIG. 9B is a cross-sectional view taken along the line IXB—IXB in FIG. 9A.

As illustrated in FIGS. 9A and 9B, an additional groove 26 may be formed at the adhesion surface 23 of the stepped portion 22 in parallel with the first formed groove 24. An increased number of grooves ensures that an excessive portion of the adhesive 30 is surely forced to flow into the grooves 24 and 26, and as a result, it is possible to surely prevent the adhesive 30 from being forced out into the opening 6 or onto an upper surface of the aperture 10.

It is preferable that the additional groove 26 is at least partially in communication with the groove 24. For instance, the through-holes 25 may be designed to extend to the additional groove 26 for communicating the additional groove 26 to the groove 24. By communicating the additional groove 26 and the groove 24 to each other, air existing in the additional groove 26 is readily discharged, and the excessive adhesive 30 smoothly flows into the additional groove 26.

Though not illustrated, both the aperture 10 and the holder 20 may be formed with a groove or grooves. Specifically, the aperture 10 may be formed at a lower surface thereof with a groove or grooves, as illustrated in FIG. 6A, and in addition, the holder 20 may be formed at the adhesion surface 23 of the stepped portion 22 with a groove or grooves, as illustrated in FIGS. 8B and 9B. However, if too many grooves are formed at a lower surface of the aperture 10 and/or at the adhesion surface 23, a sufficient contact area between the aperture 10 and the holder 20 could not be ensured, which would bring a problem of reduction in contact strength. Hence, it would be necessary to select an appropriate number of grooves and an appropriate width of a groove.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-238155 filed on Sep. 3, 1997 including specification, claims, drawings and summary is incorporated herein by reference in its entirety.

What is claimed is:

1. An apparatus used for forming a pattern on a substrate by photolithography with electron beams, said apparatus comprising:

(a) an aperture section formed with at least one opening through which electron beams are to pass; and (b) a holder for fixedly supporting said aperture section therewith by means of an adhesive, wherein at least one of the surfaces of said aperture section and said holder at which said aperture section is adhesively fixed to said holder, is formed with at least one groove for receiving excessive portions of said adhesive.

2. The apparatus as set forth in claim 1, wherein said at least one surface is of said aperture section, and formed with a plurality of grooves along an edge of said aperture section for receiving excess adhesive.

3. The apparatus as set forth in claim 1, wherein said at least one surface is of said holder, and formed with a plurality of grooves along an edge of said holder for receiving excess adhesive.

4. The apparatus as set forth in claim 3, wherein said holder is formed with at least one through-hole communicating with at least one of said plurality of grooves to the atmosphere.

5. The apparatus as set forth in claim 4, wherein said plurality of grooves are in communication with one another.

6. An apparatus used for forming a pattern on a substrate by photolithography with electron beams, said apparatus comprising:

(a) an aperture section formed with at least one opening through which electron beams are to pass; and (b) a holder for fixedly supporting said aperture section therewith by means of an adhesive, said holder having formed at a surface, at which said aperture section is adhesively fixed to said holder, at least one groove for receiving an excessive portion of said adhesive, along an edge of said holder, said holder further having a plurality of through-holes perpendicularly extending from said at least one groove to communicate said at least one groove to the atmosphere.

* * * * *